(12) United States Patent
Singor (10) Patent No.: US 10,454,268 B2
(45) Date of Patent: Oct. 22, 2019

(54) SYSTEM AND METHOD OF HIGH SPEED, HIGH VOLTAGE SWING ELECTROSTATIC DISCHARGE PROTECTION

(71) Applicant: SILICON LABORATORIES INC., Austin, TX (US)

(72) Inventor: Henry W Singor, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 263 days.

(21) Appl. No.: 15/242,652

(22) Filed: Aug. 22, 2016

(65) Prior Publication Data

US 2018/0054054 A1  Feb. 22, 2018

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0259* (2013.01)

(58) Field of Classification Search
CPC .. H02H 9/046; H01L 27/0255; H01L 27/0259
USPC .......................................................... 361/56
See application file for complete search history.

(56) References Cited

U.S. PATENT DOCUMENTS

| | | | | | |
|---|---|---|---|---|---|
| 3,267,377 | A | * | 8/1966 | Mandoli | G01R 15/005 324/115 |
| 3,848,156 | A | * | 11/1974 | Tolstov | H02H 9/04 315/190 |
| 5,530,612 | A | * | 6/1996 | Maloney | H01L 27/0251 361/118 |
| 7,408,752 | B2 | * | 8/2008 | Ma | H01L 27/0259 361/111 |
| 2010/0102735 | A1 | * | 4/2010 | Chang | H05B 33/0821 315/192 |

* cited by examiner

*Primary Examiner* — Zeev V Kitov
(74) *Attorney, Agent, or Firm* — Gary Stanford; James W. Huffman (57) ABSTRACT

An ESD protection circuit for an IC having multiple diodes coupled in series between a signal pad and a reference pad including a first diode coupled to the signal pad, a last diode coupled to the reference pad, and at least one intermediate diode. The protection circuit includes a bias network which may include one or more resistors, each coupled in parallel with a corresponding intermediate diode. One or more capacitors may be included, each coupled in parallel with a corresponding intermediate diode. For diode strings with four or more diodes, the resistances of the resistors may increase in the direction from the signal pad to the reference pad. The capacitances of the capacitors, if included, may decrease in the direction from the signal pad to the reference pad. The reference pad may be a voltage supply pad, such as a ground pad or a positive supply voltage pad.

16 Claims, 6 Drawing Sheets

SYSTEM AND METHOD OF HIGH SPEED, HIGH VOLTAGE SWING ELECTROSTATIC DISCHARGE PROTECTION

BACKGROUND OF THE INVENTION

Field of the Invention

The present invention relates in general to electrostatic discharge (ESD) protection, and more particularly to a high speed, high voltage swing ESD protection scheme that linearizes the load of the ESD protection devices to prevent nonlinear load anomalies during normal operation.

Description of the Related Art

A known electrostatic discharge (ESD) scheme is to place a string of diodes between a protected pad or node and a reference pad of an integrated circuit (IC) or other semiconductor device. The reference pad may be a voltage supply pad, such as ground pad (GND) or positive supply voltage pad (e.g., for receiving VDD), but may also be any other reference node or voltage level on the IC. Generally, the ESD scheme is intended to protect against excessive voltage and/or current from damaging the semiconductor device. Each diode of the diode string is oriented to direct a majority of the ESD current to flow between the protected pad and the reference pad while preventing excessive voltage or current from damaging the IC.

Figure 1:
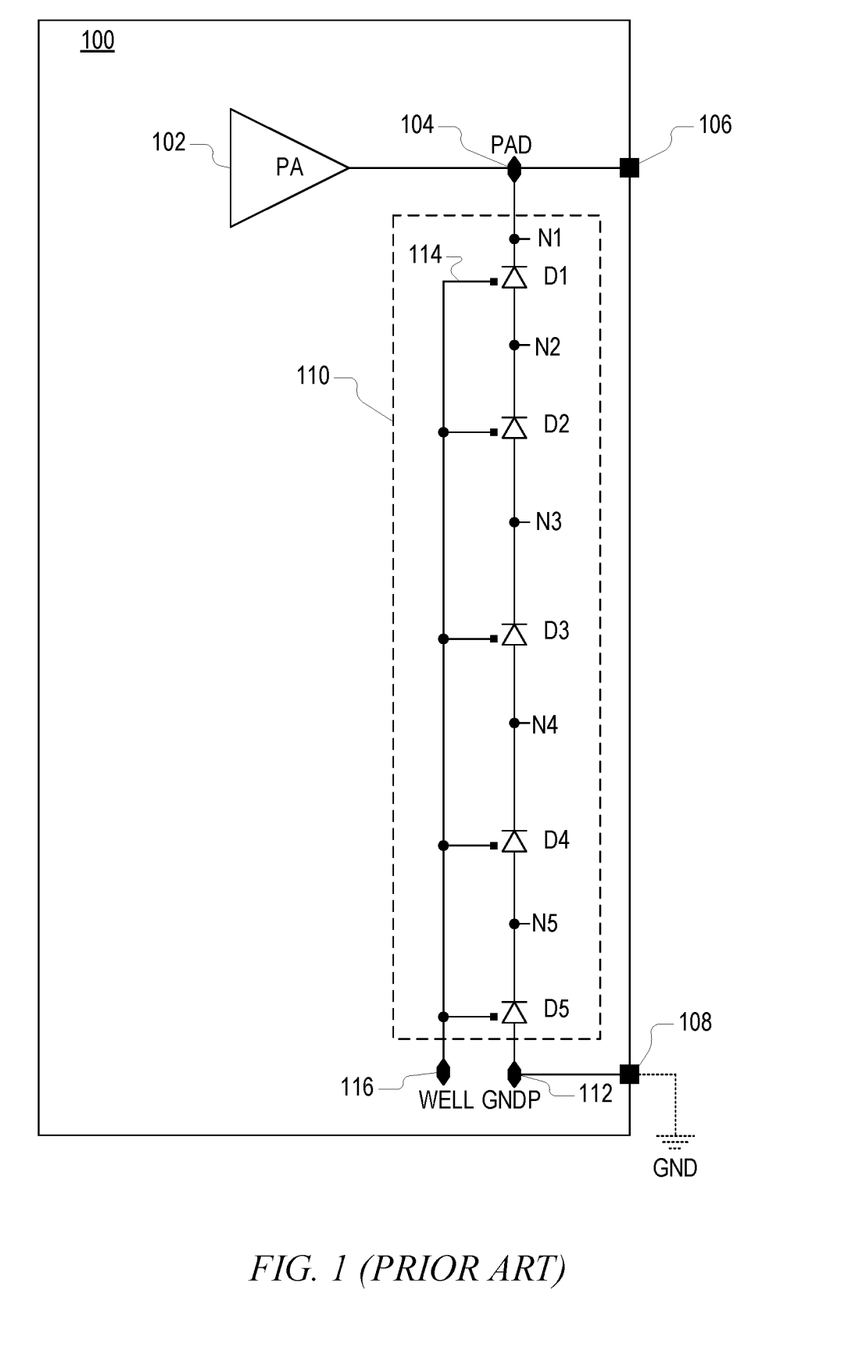
FIG. 1 is a simplified schematic and block diagram of a semiconductor device or IC illustrating an ESD circuit for negative ESD protection.

FIG. 1 is a simplified schematic and block diagram of a semiconductor device or integrated circuit (IC) 100 illustrating an ESD circuit 110. The IC 100 includes an internal signal pad 104 which is electrically connected to an external pin 106 of the IC 100, and also includes an internal ground pad (GNDP) 112 which is electrically connected to another external pin 108. In this case, the pin 108 is intended to be externally connected to a ground (GND) voltage (as shown using dotted lines) when connected to the circuit. The ESD circuit 110 is shown as a string of diodes coupled between the pads 104 and 112, in which the diode string operates to direct a majority of the ESD current between the ground pad 112 and the external pin 106 via the signal pad 104 of the IC 100, while also preventing excessive voltage from damaging the IC 100. As noted above, the ground pad 112 may be any reference pad other than the ground pad 112 (GNDP).

A similar ESD circuit may be used for protection against positive ESD pulses. As an example, an identical or similar string of diodes (e.g., same or different number) may be coupled between a reference pad and the signal pad 104. Again, the reference pad may be a voltage supply pad, such as ground (GND) or positive supply voltage (e.g., VDD), but may also be any other reference voltage level on the IC. In the "positive" ESD case, each diode of the diode string is oriented in the opposite direction and operates to direct a majority of ESD current between the reference and signal pads and to prevent excessive voltage. In general, a diode string may be included to provide protection against positive or negative ESD pulses that would otherwise allow excessive currents to damage the IC 100. Also, it is understood that the same technique(s) may be equally applied to other pins or even all of the pins of the IC 100.

The ESD circuit 110 shown in FIG. 1 is a diode string that includes 5 internal protection diodes D1, D2, D3, D4 and D5 coupled in series between the pads 104 and 112. In particular, the cathode of D1 is coupled to the signal pad 104 at a first node N1, the cathode of D2 is coupled to the anode of D1 at a second node N2, the cathode of D3 is coupled to the anode of D2 at a third node N3, the cathode of D4 is coupled to the anode of D3 at a fourth node N4, the cathode of D5 is coupled to the anode of D4 at a fifth node N5, and the anode of D5 is coupled to the ground pad 112. A similar ESD circuit may be coupled between the pads 104 and 112 with the diodes oriented in the opposite direction.

The number of diodes multiplied by the forward voltage of each diode determines the voltage deviation of the protected pad during normal operation. Although 5 diodes are shown, it is understood that any other suitable number (e.g., 3 or more) may be included in the diode string depending upon the desired voltage deviation. If the forward-bias voltage of each diode is about 0.5 Volts (V) to 0.7V (depending upon current level), then the total voltage is about 2.5V-3.5V which determines a predetermined voltage limit during normal operation. The number of diodes also determines the relative level of protection in response to an ESD pulse. In the event of an ESD pulse or the like applied to the pin 106, the diodes D1-D5 are strongly forward-biased to clamp the voltage at a maximum voltage level, which is generally higher than the predetermined voltage limit of normal operation. For example, an ESD pulse may cause a current through each diode of 1 Ampere (A) or more with a voltage of 1V or more, such that the voltage drop across the diode string may be in the range of 5V-7.5V or the like, but still well below an excessive voltage level that would damage or destroy the IC 100. In this manner, the ESD circuit 110 provides an alternate current path to protect internal devices of the IC 100 from otherwise excessive voltages and currents of the ESD pulse. An example of an internal device is a power amplifier (PA) 102 having an output connected to the signal pad 104 for driving an amplified high frequency signal (e.g., radio signal or the like) on the external pin 106 to external devices (not shown).

In many manufacturing process configurations, each of the diodes D1-D5 is implemented within an N-well that isolates the diode from the substrate of the IC 100. In the illustrated configuration, the diode N-wells are coupled together via connection 114 to a common well 116. In one embodiment, the diodes D1-D5 may be implemented within separate N-wells in which connection 114 couples the separate N-wells together. In another embodiment, the diodes D1-D5 may be implemented within the same N-well, in which connection 114 is an inherent connection. Although the well 116 may be grounded, it is usually coupled to a power supply output to receive an appropriate bias voltage. In this manner, the well 116 provides a low impedance potential. In alternative configurations, each of the diodes of the diode string have an inherent substrate connection that also provides a low impedance potential in a similar manner.

Figure 2:
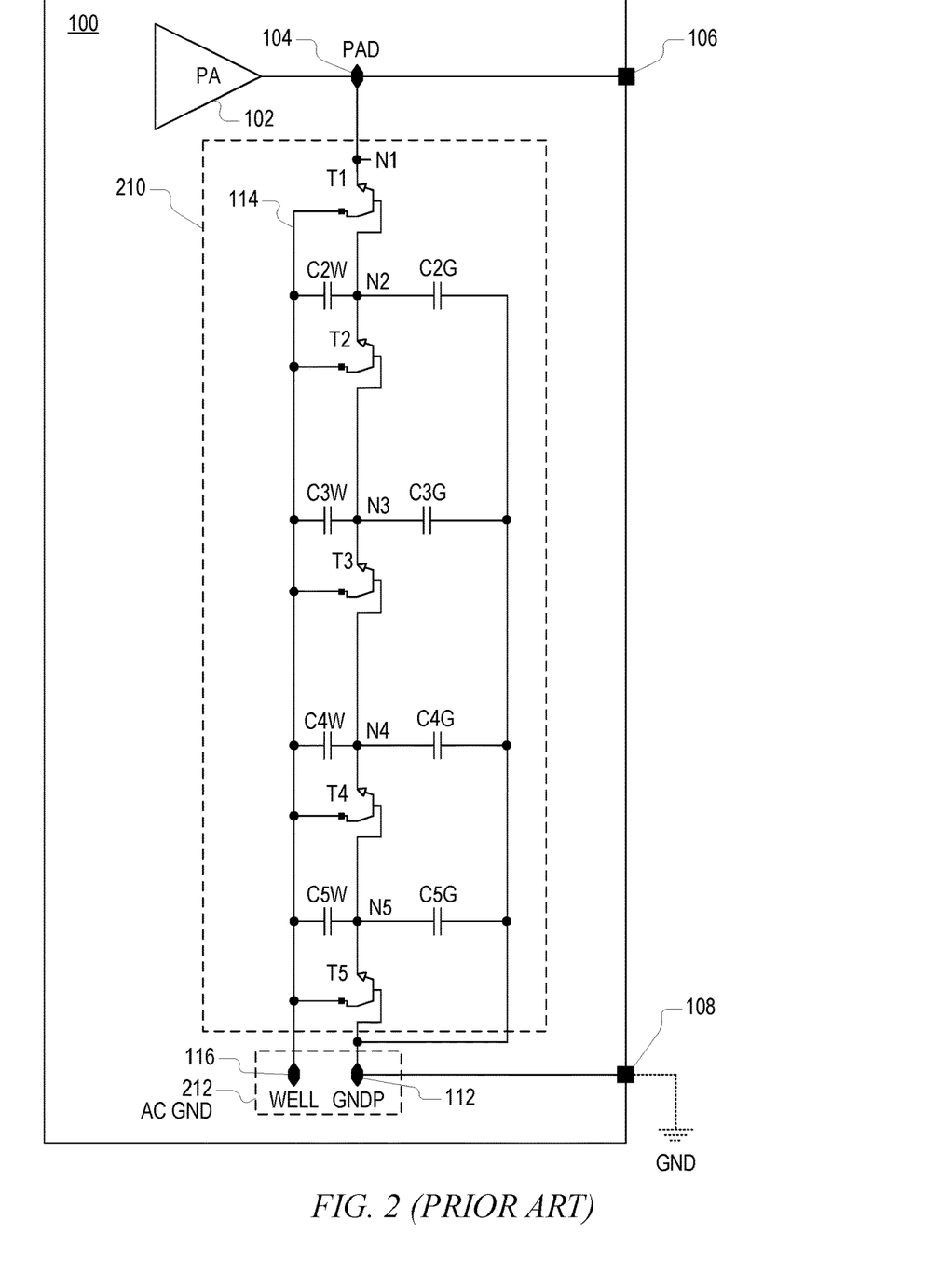
FIG. 2 is a simplified schematic and block diagram of the IC including the ESD circuit of FIG. 1, except that the circuitry of the ESD circuit is replaced by a functionally equivalent circuit that illustrates the inherent parasitic devices.

FIG. 2 is a simplified schematic and block diagram of the IC 100 including the ESD circuit 110, except that the circuitry of the ESD circuit 110 is replaced by a functionally equivalent circuit 210 that illustrates the inherent parasitic devices. The diodes D1-D5 incorporate inherent parasitic transistors and capacitors with amplifying characteristics. Each protection diode is replaced by an N-type transistor or NPN bipolar junction transistor (BJT) in which the anode of the diode, or "p" junction, forms the base terminal of the parasitic transistor, the cathode of the diode, or "n" junction, forms the emitter of the parasitic transistor, and the N-well of the diode forms the collector of the parasitic transistor. Thus, the diodes D1, D2, D3, D4 and D5 are modeled by transistors T1, T2, T3, T4 and T5, respectively. The emitters of the transistors T1-T5 are coupled to nodes N1-N5, respectively, the bases of the transistors T1-T5 are coupled to nodes N2-N5 and the ground pad 112, respectively, and the collectors of the transistors T1-T5 are coupled together to the well connection via the connection 114.

A pair of parasitic capacitors are associated with each of the intermediate nodes N2-N5. As shown, a first set of capacitors C2G, C3G, C4G, and C5G each have one end coupled to the ground node 112 and another end coupled to a respective one of the nodes N2-N5. Also, a second set of capacitors C2W, C3W, C4W, and C5W each have one end coupled to the well 116 and another end coupled to a respective one of the nodes N2-N5. Although the well 116 and the ground pad 112 may not be connected together, from an alternating current (AC) perspective, they are both direct-current (DC) nodes and collectively represent an AC ground (AC GND) 212. Thus, from an AC perspective with respect to the signal pad 104 (and thus the output of the PA 102), C2G and C2W are coupled in parallel between node N2 and AC GND 212, C3G and C3W are coupled in parallel between node N3 and AC GND 212, C4G and C4W are coupled in parallel between node N4 and AC GND 212, and C5G and C5W are coupled in parallel between node N5 and AC GND 212. The size of each of the parasitic capacitors depends upon many factors including the manufacturing process and process variations. In one embodiment, the capacitors C2W-C5W range from about 4 to 10 femtofarads (fF) and the capacitors C2G-C5G range from less than 1 fF to about 5 fF. From the AC perspective, the combined parasitic capacitance (parallel capacitances) at each node N2-N5 is about 8 fF-10 fF.

The ratio of the currents flowing into the "well" node or collector of the transistor to that flowing into the "p" junction or base of the transistor is referred to as the "Beta" ($\beta$) of each parasitic transistor. $\beta$ is process and layout dependent and can be significantly larger than 1. $\beta$, for example, may range between 1 and 5 for certain processes. In this manner, the first combined parasitic capacitance (C2G+C2W) at the anode (node N2) of the first diode D1 in the diode string is magnified by the $\beta$ of the first parasitic transistor T1 as it is referred to the first node N1 when D1 is forward-biased. More particularly, the first combined parasitic capacitance at node N2 appears as $(\beta+1)(C2G+C2W)$ to node N1. The second combined parasitic capacitance (C3G+C3W) at the anode (node N3) of the second diode D2 is magnified by the $\beta$ of both the first and the second parasitic transistor, or $(\beta+1)^2$, so that the second combined parasitic capacitance appears as $(\beta+1)^2(C3G+C3W)$ to node N1 when D2 is forward-biased. Continuing in this manner, the third combined parasitic capacitance (C4G+C4W) appears as $(\beta+1)^3(C4G+C4W)$ to node N1 when D3 is forward-biased, and the fourth combined parasitic capacitance (C5G+C5W) appears as $(\beta+1)^4(C5G+C5W)$ to node N1 when D4 is forward-biased. Thus, the total combined parasitic capacitance TC that may be reflected to node N1, and thus to the signal pad 104 at the output of the PA 102, is $TC=(\beta+1)(C2G+C2W)+(\beta+1)^2(C3G+C3W)+(\beta+1)^3(C4G+C4W)+(\beta+1)^4(C5G+C5W)$.

In summary, a diode string provided for ESD protection may cause undesireable characteristics during normal operation. As illustrated in FIG. 2, the parasitic transistors amplify the parasitic capacitances of the protection diodes in the diode string presenting a significant capacitive load to the signal pad 104. Although the capacitive load may not be consequential for some pins, it may cause undesired loading characteristics for internal devices driving other pins, such as, for example, the PA 102 driving pin 106. As a further complication, the parasitic capacitances further down the diode string from D1 to D5 increasingly appear as the latter diodes become strongly forward-biased. As the signal pad 104 is driven below ground, the voltage drop across each diode decreases down the diode string so that the closer diodes become forward-biased sooner (or faster) than the farther diodes. For example, the PA 102 may drive the signal pad 104 such that only D1 is strongly forward-biased and the remaining diodes are not, so that the added parasitic load is mainly $TC1=(\beta+1)(C2G+C2W)$. As the PA 102 drives the signal pad 104 further, both D1 and D2 may become strongly forward-biased while the remaining diodes are not, so that the added parasitic load is mostly $TC2=(\beta+1)(C2G+C2W)+(\beta+1)^2(C3G+C3W)$, and so on. In this manner, the parasitic load presented by the diode string to the output of the PA 102 is non-linear and depends on the magnitude and rate of change of the output level of the PA 102. Although it is less consequential for DC and/or low frequency signals, the non-linear parasitic load is more substantial for higher frequency signals and causes undesired distortion for higher frequency applications, such as radio power amplifiers and the like.

SUMMARY OF THE INVENTION

An integrated circuit including an electrostatic discharge (ESD) protection circuit according to one embodiment includes multiple diodes coupled in series (e.g., diode string) between a signal pad and a reference pad including a first diode coupled to the signal pad, a last diode coupled to the reference pad, and at least one intermediate diode, and a bias network including one or more resistors each coupled in parallel with a corresponding intermediate diode. The bias network may be implemented as a resistor-capacitor (RC) bias network including one or more capacitors each coupled in parallel with a corresponding intermediate diode. The orientation of the diodes determine the polarity of ESD protection (positive or negative).

In general, the diode string includes at least three diodes with one or more intermediate diodes, and the bias network includes a resistor coupled in parallel with each intermediate diode. The bias network may further include a capacitor coupled in parallel with each intermediate diode. For diode strings with four or more diodes, the resistances of the resistors of the bias network may increase from a first resistor coupled in parallel with the first intermediate diode to a last resistor coupled in parallel with the last intermediate diode. If capacitors are included, the capacitances of capacitors of the bias network may decrease from a first capacitor coupled in parallel with the first intermediate diode to a last capacitor coupled in parallel with the last intermediate diode. Furthermore, a capacitance for at least one of the capacitors may be selected based on a high frequency level of at least one of a pair of intermediate nodes to which the capacitor is coupled.

The bias network is added to the diode string to provide bias current to the subsequent diodes in the string after the first diode. In this way, the circuitry driving the protected node drives the second node through the first diode, and the subsequent nodes are driven from the second node through the bias network. By not relying on current flowing in the diodes themselves to bias diodes further along the string, the problem of parasitic capacitances being multiplied by parasitic transistors each time they are referred forward through a diode is circumvented. The reference pad may be voltage supply pad for receiving a ground supply voltage or a positive supply voltage (e.g., VDD) or the like.

A method of providing electrostatic discharge protection to an integrated circuit according to one embodiment includes coupling multiple diodes in series between a signal pad and a reference pad of the integrated circuit, in which the diodes include a first diode coupled to the signal pad, a last diode coupled to the reference pad, and at least one intermediate diode coupled between the first and last diodes, and coupling each of at least one resistor in parallel with a corresponding one of the at least one intermediate diode. The method may include coupling each of at least one capacitor in parallel with a corresponding one of the at least one intermediate diode.

When four or more diodes are coupled in the diode string, the method includes coupling each of multiple resistors in parallel with a corresponding intermediate diode. The method may further include coupling each of multiple capacitors in parallel with a corresponding intermediate diode. The method may include increasing resistances of the resistors from a first resistor coupled in parallel with the first intermediate diode to a last resistor coupled in parallel with the last intermediate diode. When capacitors are included, the method may include decreasing capacitances of the capacitors from a first capacitor coupled in parallel with the first intermediate diode to a last capacitor coupled in parallel with the last intermediate diode.

A method of linearizing load of a string of diodes coupled in series between a signal pad and a reference pad of an integrated circuit according to one embodiment includes coupling each of at least one resistor in parallel with a corresponding one of the at least one intermediate diode, and coupling each of at least one capacitor in parallel with a corresponding one of the at least one intermediate diode. When four or more diodes are coupled in the diode string, multiple resistors and capacitors may be include in which each resistor-capacitor pair is coupled in parallel with a corresponding intermediate diode in the diode string. The method may include increasing resistances of the resistors from a first resistor coupled in parallel with the first intermediate diode to a last resistor coupled in parallel with the last intermediate diode. The method may further include decreasing capacitances of the capacitors from a first capacitor coupled in parallel with the first intermediate diode to a last capacitor coupled in parallel with the last intermediate diode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventor has recognized the non-linear parasitic load characteristics of protection diode strings. He has therefore developed a high speed, high voltage swing ESD protection scheme that minimizes or otherwise reduces the parasitic load characteristics of protection diode strings. A bias network is added to the diode string to provide bias current to the subsequent diodes in the string. In this way, the circuitry driving the protected node drives the second node through the first diode, and the subsequent nodes are driven from the second node through the bias network. By not relying on current flowing in the diodes themselves to bias diodes further along the string, the problem of parasitic capacitances being multiplied by parasitic transistors each time they are referred forward through a diode is circumvented.

Figure 3:
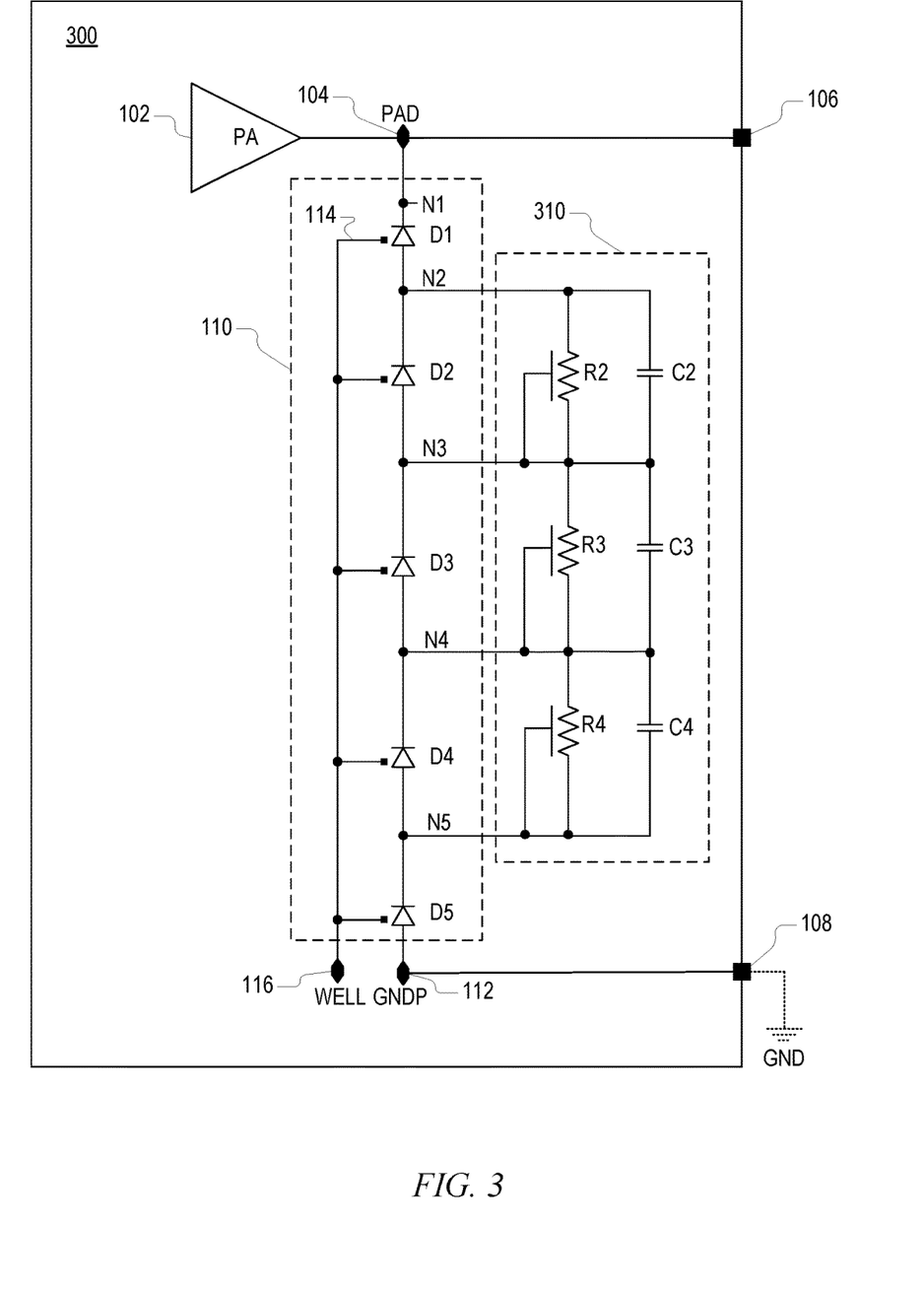
FIG. 3 is a simplified schematic and block diagram of an IC including a bias network implemented according to an embodiment of the present invention coupled to the protection diodes of the ESD circuit of FIG. 1.

FIG. 3 is a simplified schematic and block diagram of an IC 300 including a bias network 310 implemented according to an embodiment of the present invention coupled to the protection diodes D1-D5 of the ESD circuit 110. In this case, the bias network 310 is a resistor-capacitor (RC) bias network. D1 is the first diode, D5 is the last diode, and diodes D2-D4 are the intermediate diodes of the diode string in the illustrated embodiment. The nodes N2-N5 are the intermediate nodes formed by the diode string (N1 is connected to the signal pad 104). The bias network 310 includes a first resistor R2 and a first capacitor C2 coupled in parallel with each other and with D2 between intermediate nodes N2 and N3, a second resistor R3 and a second capacitor C3 coupled in parallel with each other and with D3 between intermediate nodes N3 and N4, and a third resistor R4 and a third capacitor C4 coupled in parallel with each other and with D4 between intermediate nodes N4 and N5. Each of the resistors R2, R3 and R4 may include a well or substrate parasitic path. In the illustrated embodiment, the well connection of R2 is coupled to node N3, the well connection of R3 is coupled to node N4, and the well connection of R4 is coupled to node N5.

The first resistor R2 provides DC bias current for the protection diodes D3-D5, the second resistor R3 provides DC bias current for D4 and D5, and the third resistor R4 provides DC bias current for D5. In one embodiment, the resistances are selected to be R2<R3<R4 since R2 provides bias current for the latter three diodes, R3 provides bias current for the latter two diodes, and R4 provides bias current for the last diode in the diode string. In another embodiment, the resistances may be selected such that R4≈2R3≈4R2 in which "≈" is intended to mean "approximately equal to." In various embodiments, each of the resistors R2-R4 are on the order of several hundred kilo-ohms (kΩ) to several mega-ohms (MΩ). As an example, R2 may be 500 kΩ-600 kΩ, R3 may be 1 MΩ-1.5 MΩ, and R4 may be 2 MΩ-4 MΩ. The specific resistance values may vary from one configuration to the next and may depend upon the particular implementation and manufacturing process.

The capacitors C2-C4 provide AC biasing for the diodes D3-D5. In one embodiment, the capacitances of the capacitors C2-C4 are configured such that C2>C3>C4. In another embodiment, the capacitances of the capacitors C2-C4 are configured such that C2≈2C3≈4C4. The specific capacitances may vary based on a variety of factors, such as high frequency level of a corresponding one of the nodes N2-N4. For example, the capacitance may be reduced for a node with a high frequency level. In one embodiment, the capacitances of the capacitors C2-C4 range from about 30 fF to 100 fF. The specific capacitance values may vary from one configuration to the next and may depend upon the particular implementation and manufacturing process.

In general, the bias network 310 provides alternative bias current paths to bias the diodes D3-D5. In this manner, the output of PA 102 pulls down node N2 through D1 and the nodes N3-N5 are pulled down from node N2 through the bias network 310. Essentially, the bias network 310 provides bias current paths so that diode biasing does not rely solely upon the current flowing through the diodes themselves. In this manner, in response to voltage excursions of the signal pad 104 during normal operation, such as driven by the PA 102, the voltage across each of the diodes D2-D5 is distributed more evenly which avoids stair-step activation of the diodes which reduces the likelihood of the latter diodes D3-D5 from being forward-biased. The bias network 310 provides alternative paths in addition to the current flowing in the diodes themselves to bias diodes further down the string to reduce or minimize parasitic capacitances being multiplied by the transistor β factor each time they are referred forward through a diode. The bias network 310 therefore linearizes the AC load presented to the PA 102 to prevent nonlinear load anomalies during normal operation.

Although the ESD circuit 110 is shown coupled to the ground pad 112 which is typically coupled to receive a ground voltage (e.g., GND), the ESD circuit 110 may alternatively be coupled to any other reference pad, such as a positive supply voltage pad (e.g., receiving supply voltage VDD), or any other reference pad receiving any other voltage level. The bias network 310 is coupled to the ESD circuit 110 in substantially the same way and operates in substantially the same manner.

Figure 4:
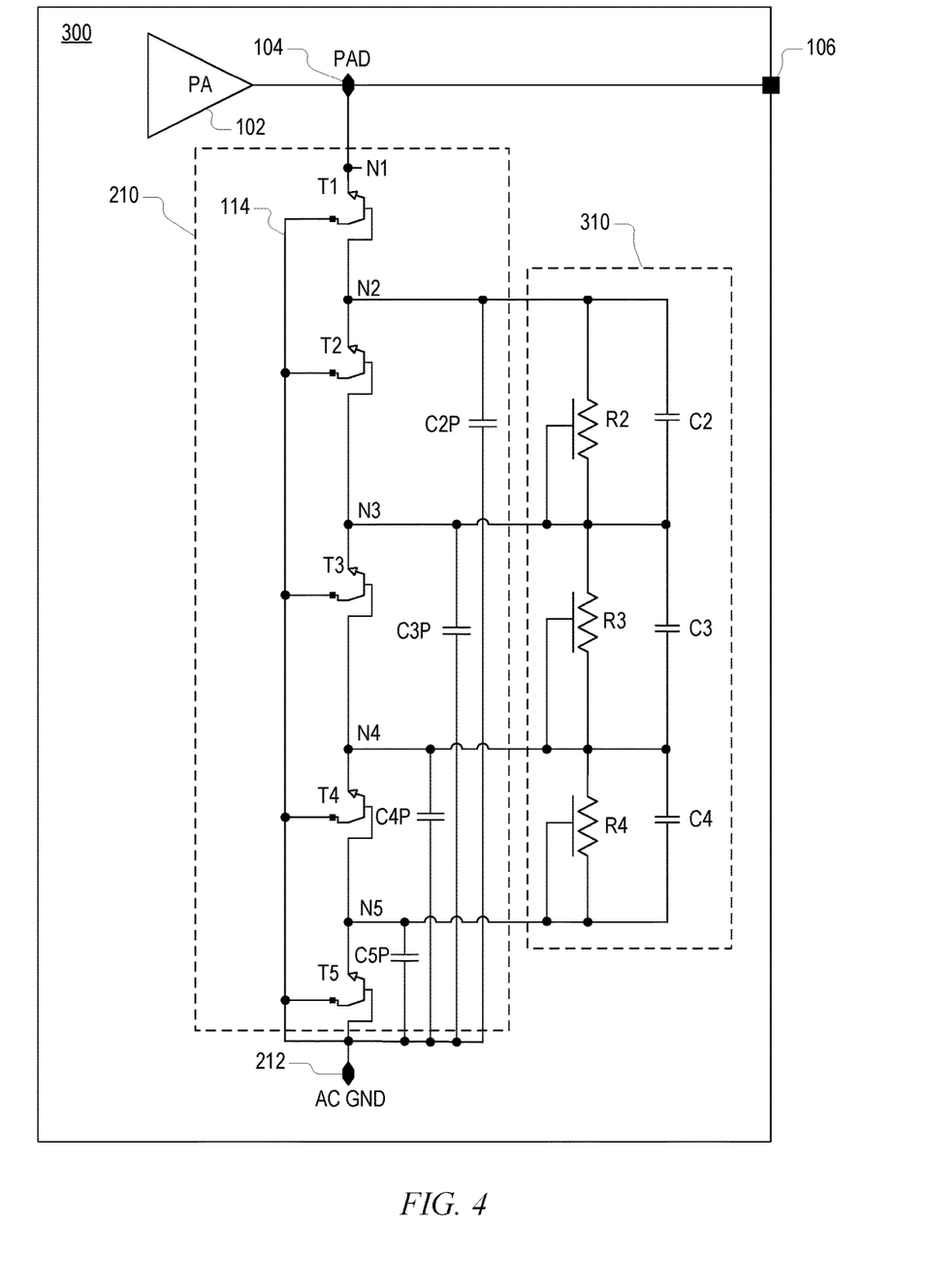
FIG. 4 is a simplified schematic and block diagram of the IC including the bias network of FIG. 3 coupled to the ESD circuit, in which the ESD circuit is represented by the equivalent circuit shown in modified form from an AC perspective.

FIG. 4 is a simplified schematic and block diagram of the IC 300 including the bias network 310 coupled to the negative ESD circuit 110, in which the ESD circuit 110 is represented by the equivalent circuit 210 shown in modified form from an AC perspective. In particular, the ground pad 112 and the well 116 are shown in simplified form as the AC GND 212, in which the connections of the equivalent circuit 210 to the ground pad 112 or the well 116 are shown coupled together to the AC GND 212. Also, each corresponding parasitic capacitance pair CW and CG is combined into a singular parasitic capacitance CP, in which C2P=C2G+C2W, C3P=C3G+C3W, C4P=C4G+C4W, and C5P=C5G+C5W. The RC bias network 310 is coupled in the same manner to the intermediate nodes N2-N5.

FIG. 4 more clearly illustrates that the resistors R2-R4 and the capacitors C2-C4 provide alternative current paths to the intermediate nodes N3-N5 and thus to the parasitic capacitances C3P-C5P. R4 and C4 provide additional current paths to C5P bypassing transistors T4, R3 and C3 provide additional current paths to C4P (and to C5P via R4 and C4) bypassing transistors T3 and T4, and R2 and C2 provide additional current paths to C3P (and to C4P and C5P via R3, R4 and C3, C4) bypassing transistors T2, T3 and T4.

Figure 5:
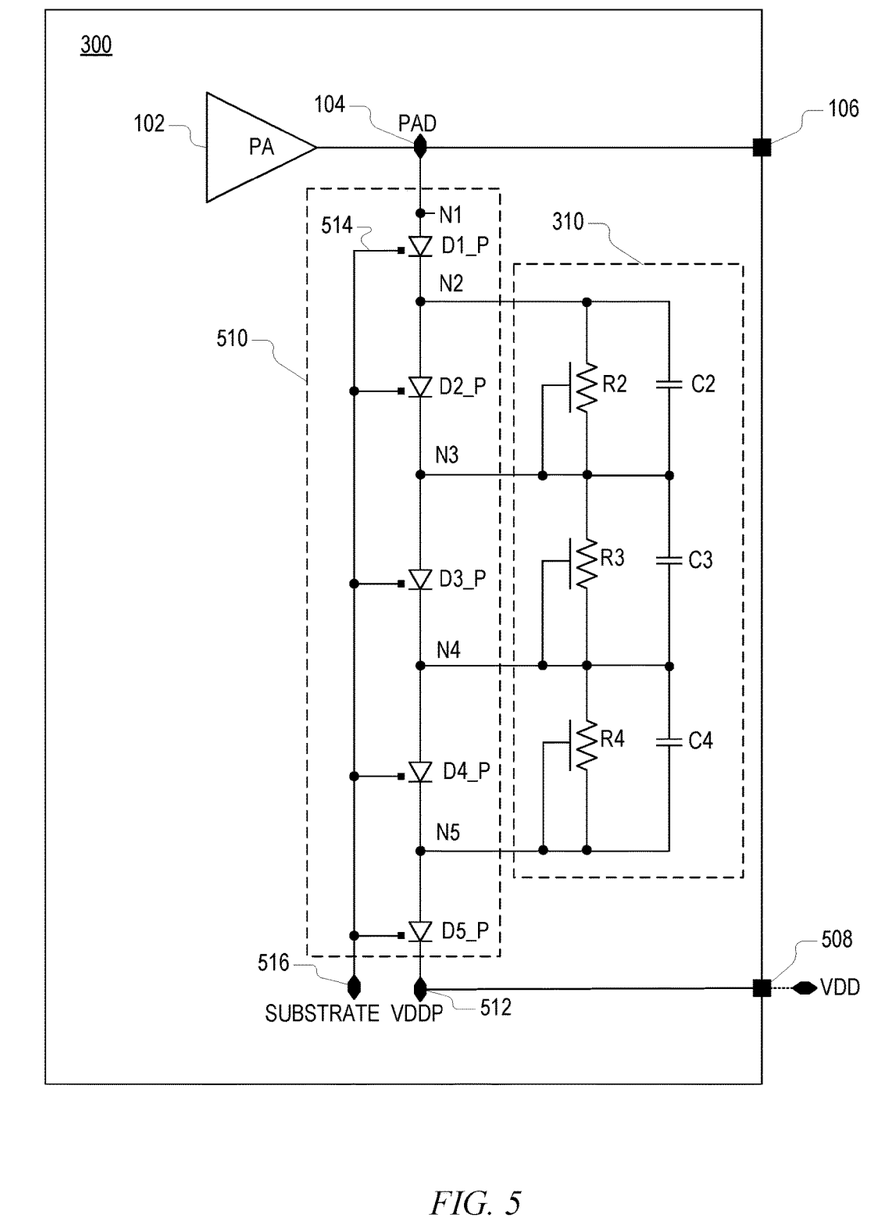
FIG. 5 is a simplified schematic and block diagram of the IC of FIG. 3 including the bias network of FIG. 3 coupled to the protection diodes of an ESD circuit provided for positive ESD protection.

FIG. 5 is a simplified schematic and block diagram of the IC 300 including the bias network 310 coupled to the protection diodes of another ESD circuit 510 provided for positive ESD protection. In this case, the ESD circuit 510 is coupled between the interal signal pad 104 and an internal positive voltage supply pad (VDDP) 512 connected to an external pin 508 for protection against a positive ESD pulse. The pin 508 may be coupled to receive the positive supply VDD (shown with dotted line). The ESD circuit 510 includes a similar internal diode string of 5 diodes D1_P, D2_P, D3_P, D4_P and D5_P coupled in series between the pads 104 and 512 in similar manner as for the ESD circuit 110. Each of the diodes D1_P-D5_P function in a similar manner as the diodes D1-D5 (even if physically implemented in a different manner), in which the suffix "_P" is appended to distinguish the diodes of the diode string configured for positive ESD protection. The diodes D1_P-D5_P may be implemented within a common substrate, which is illustrated by a connection 514 to a common substrate 516. The nodes N1_N5 between the diode string are provided in similar manner even though the orientation of the diodes is reversed.

The diodes are oriented in the reverse direction, such that the anode of D1_P is coupled to the signal pad 104 via node N1, the anode of intermediate diode D2_P is coupled to the cathode of D1_P via intermediate node N2, the anode of intermediate diode D3_P is coupled to the cathode of D2_P via intermediate node N3, the anode of intermediate diode D4_P is coupled to the cathode of D3_P via intermediate node N4, the anode of diode D5_P is coupled to the cathode of D4_P via intermediate node N5, and the cathode of D5_P is coupled to the VDDP pad 512.

The bias network 310 is coupled to the ESD circuit 510 via the intermediate nodes N2-N5 in substantially the same manner. Thus, R2 and C2 are coupled in paralled between nodes N2 and N3, R3 and C3 are coupled in paralled between nodes N3 and N4, and R4 and C4 are coupled in paralled between nodes N4 and N5. Each of the resistors may include a well connection and are coupled in the same manner.

Operation is similar except that current flow occurs in the opposite direction. A positive ESD voltage spike applied to pin 106 forward-biases the diodes D1_P-D5_P of the ESD circuit 510 and the diodes prevent the voltage from rising above VDD by an excessive amount. The diodes D1_P-D5_P may each be modeled in a similar manner as the diodes D1-D5 as shown in FIG. 2. During normal operation, if the bias network 310 were not provided and if the PA 102 drives the pin 106 above VDD, the parasitic transistors amplify the parasitic capacitances of the diodes D1_P-D5_P that would otherwise present nonlinear load anomalies in a similar manner as described for FIG. 2.

Although the ESD circuit 510 is shown coupled to the positive voltage supply pad 512 which is typically charged to VDD during normal operation, the ESD circuit 510 may alternatively be coupled to any other reference pad, such as a ground pad (e.g., GNDP 112 for coupled to GND), or any other reference pad receiving any other voltage level. The bias network 310 is coupled to the ESD circuit 510 in substantially the same way and operates in substantially the same manner.

The bias network 310 provides bias current to the subsequent diodes in the string to linearize the load. In this manner, the output of PA 102 pulls up node N2 through D1_P and the nodes N3-N5 are pulled up from node N2 through the bias network 310. Essentially, the bias network 310 provides bias current paths so that diode biasing does not rely solely upon the current flowing through the diodes themselves. In this manner, in response to voltage excursions of the signal pad 104 during normal operation, such as driven by the PA 102, the voltage across each of the diodes D2_P-D5_P is distributed more evenly which avoids stair-step activation of the diodes which reduces the likelihood of the latter diodes D2_P-D5_P from being forward-biased. The bias network 310 provides alternative paths in addition to the current flowing in the diodes themselves to bias diodes further down the string to reduce or minimize parasitic capacitances being multiplied by the transistor β factor each time they are referred forward through a diode. The bias network 310 therefore linearizes the AC load presented to the PA 102 to prevent nonlinear load anomalies during normal operation.

Figure 6:
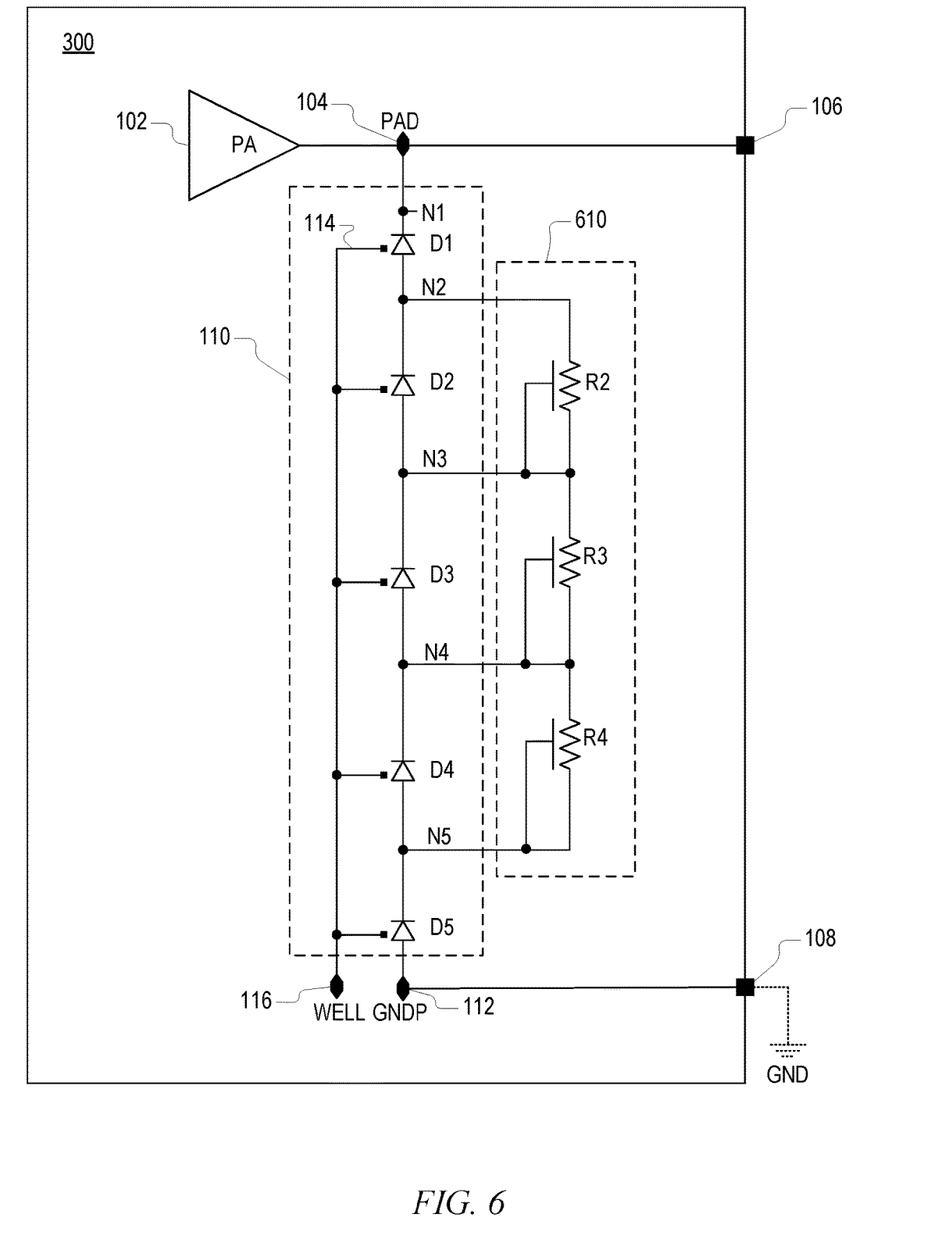
FIG. 6 is a is a simplified schematic and block diagram of the IC of FIG. 3 including a bias network implemented according to an alternative embodiment of the present invention including only resistive paths.

FIG. 6 is a is a simplified schematic and block diagram of the IC 300 including a bias network 610 implemented according to an alternative embodiment of the present invention coupled to the protection diodes D1-D5 of the ESD circuit 110. The bias network 610 is similar to the bias network 310 in which it includes the resistors R2-R4, but the capacitors C2-C4 are omitted. In this manner, the bias network 610 is a resistive network rather than an RC network.

In a similar manner as described for the bias network 310, the first resistor R2 of the bias network 610 provides DC bias current for the protection diodes D3-D5, the second resistor R3 provides DC bias current for D4 and D5, and the third resistor R4 provides DC bias current for D5. In one embodiment, the resistances are selected to be R2<R3<R4. In another embodiment, the resistances may be selected such that R4≈2R3≈4R2. In various embodiments, each of the resistors R2-R4 are on the order of several hundred kilo-ohms to several mega-ohms. As an example, R2 may be 500 kΩ-600 kΩ, R3 may be 1 MΩ-1.5 MΩ, and R4 may be 2 MΩ-4 MΩ. The specific resistance values may vary from one configuration to the next and may depend upon the particular implementation and manufacturing process.

In a similar manner as described for the bias network 310, the bias network 610 provides alternative bias current paths to bias the diodes D3-D5. In this manner, the output of PA 102 pulls down node N2 through D1 and the nodes N3-N5 are pulled down from node N2 through the bias network 310. Essentially, the bias network 310 provides bias current paths so that diode biasing does not rely solely upon the current flowing through the diodes themselves. In this manner, in response to voltage excursions of the signal pad 104 during normal operation, such as driven by the PA 102, the voltage across each of the diodes D2-D5 is distributed more evenly which avoids stair-step activation of the diodes which reduces the likelihood of the latter diodes D3-D5 from being forward-biased. The bias network 610 provides alternative paths in addition to the current flowing in the diodes themselves to bias diodes further down the string to reduce or minimize parasitic capacitances being multiplied by the transistor β factor each time they are referred forward through a diode. The bias network 610 therefore linearizes the AC load presented to the PA 102 to prevent nonlinear load anomalies during normal operation.

The bias network 610, however, does not provide AC biasing. When the capacitors are not included, the nodes further down the diode string (e.g., nodes N3-N5) take somewhat longer to reach their final values in response to a voltage change at the signal pad 104. The exclusion of the capacitors somewhat limits how quickly the output of the PA 102 (or other internal circuitry in alternative embodiments) can ramp to large negative voltages without causing large nonlinear loading effects due to charging parasitic capacitances primarily through the diode string.

Although the bias network 310 and the bias network 610 are both shown for biasing a string of 5 diodes, it is understood that the same technique may be applied to any diode string with 3 or more diodes coupled between a connection pad and a reference pad for any number of pins of an IC.

The diode string may have as few as 3 diodes including one intermediate diode coupled between 2 intermediate nodes, in which the corresponding bias network may be implemented with a single resistor coupled between the pair of intermediate nodes in parallel with the intermediate diode. Likewise, a diode string of 4 diodes includes 2 intermediate diodes coupled between 3 intermediate nodes, in which the corresponding bias network may be implemented with a first resistor coupled between the first and second intermediate nodes in parallel with the first intermediate diode closest to the connection pad, and a second resistor coupled between the second and third intermediate nodes in parallel with the second intermediate diode closest to the voltage supply pad. When four or more diodes are included in the diode string, the resistances of the resistors of the bias network may increase from a first resistor coupled in parallel with the first intermediate diode (closest to the connection pad) to a last resistor coupled in parallel with the last intermediate diode (closest to the voltage supply pad).

The bias network may be implemented as an RC bias network in which a capacitor is coupled in parallel with each resistor. The capacitances of the capacitors of the RC bias network may decrease from a first capacitor coupled in parallel with the first intermediate diode to a last capacitor coupled in parallel with the last intermediate diode.

Although the resistors may be implemented as physical resistors on the semiconductor substrate, alternative configurations are contemplated. For example, diode-coupled transistors (e.g., MOS transistors, FETs, MOSFETs, etc.) may be used to implement the resistors. In general, any suitable resistive path may be used.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An integrated circuit including an electrostatic discharge protection circuit, comprising:
   a plurality of diodes coupled in series between a signal pad coupled to an external pin and a reference pad;
   wherein said plurality of diodes comprises a first diode coupled to said signal pad, a last diode coupled to said reference pad, and at least one intermediate diode coupled between said first and last diodes; and
   a bias network, comprising:
   at least one resistor, each coupled in parallel with a corresponding one of said at least one intermediate diode; and
   at least one capacitor, each coupled in parallel with a corresponding one of said at least one intermediate diode, wherein a capacitance of said at least one capacitor is selected based on a high frequency level of at least one of a pair of intermediate nodes to which said at least one capacitor is coupled.

2. The integrated circuit of claim 1, wherein said plurality of diodes comprises at least four diodes, wherein said at least one intermediate diode comprises a plurality of intermediate diodes including a first intermediate diode coupled to said first diode and a last intermediate diode coupled to said last diode, and wherein said bias network comprises a plurality of resistors, each coupled in parallel with a corresponding one of said plurality of intermediate diodes.

3. The integrated circuit of claim 2, wherein resistances of said plurality of resistors increase from a first resistor coupled in parallel with said first intermediate diode to a last resistor coupled in parallel with said last intermediate diode.

4. The integrated circuit of claim 2, further comprising a plurality of capacitors, each coupled in parallel with a corresponding one of said plurality of intermediate diodes.

5. The integrated circuit of claim 4, wherein capacitances of said plurality of capacitors decrease from a first capacitor coupled in parallel with said first intermediate diode to a last capacitor coupled in parallel with said last intermediate diode.

6. The integrated circuit of claim 1, wherein said reference pad comprises a voltage supply pad for receiving a supply voltage.

7. The integrated circuit of claim 1, wherein:
said plurality of diodes comprises:
  said first diode having a cathode coupled to said signal pad and having an anode coupled to a first intermediate node;
  a second diode having a cathode coupled to said first intermediate node and having an anode coupled to a second intermediate node;
  a third diode having a cathode coupled to said second intermediate node and having an anode coupled to a third intermediate node;
  a fourth diode having a cathode coupled to said third intermediate node and having an anode coupled to a fourth intermediate node; and
  said last diode having a cathode coupled to said fourth intermediate node and having an anode coupled to said reference pad; and
wherein said bias network comprises a first resistor coupled between said first and second intermediate nodes, a second resistor coupled between said second and third intermediate nodes, and a third resistor coupled between said third and fourth intermediate nodes.

8. The integrated circuit of claim 7, further comprising a first capacitor coupled between said first and second intermediate nodes, a second capacitor coupled between said second and third intermediate nodes, and a third capacitor coupled between said third and fourth intermediate nodes.

9. The integrated circuit of claim 1, wherein:
said plurality of diodes comprises:
  said first diode having an anode coupled to said signal pad and having a cathode coupled to a first intermediate node;
  a second diode having an anode coupled to said first intermediate node and having a cathode coupled to a second intermediate node;
  a third diode having an anode coupled to said second intermediate node and having a cathode coupled to a third intermediate node;
  a fourth diode having an anode coupled to said third intermediate node and having a cathode coupled to a fourth intermediate node; and
  said last diode having an anode coupled to said fourth intermediate node and having a cathode coupled to said reference pad; and
wherein said bias network comprises a first resistor coupled between said first and second intermediate nodes, a second resistor coupled between said second and third intermediate nodes, and a third resistor coupled between said third and fourth intermediate nodes.

10. The integrated circuit of claim 9, further comprising a first capacitor coupled between said first and second intermediate nodes, a second capacitor coupled between said second and third intermediate nodes, and a third capacitor coupled between said third and fourth intermediate nodes.

11. A method of providing electrostatic discharge protection to an integrated circuit, comprising:
coupling a plurality of diodes in series between a signal pad and a reference pad of the integrated circuit;
wherein the plurality of diodes comprises a first diode coupled to the signal pad, a last diode coupled to the reference pad, and at least one intermediate diode coupled between the first and last diodes;
coupling each of at least one resistor in parallel with a corresponding one of the at least one intermediate diode; and
coupling each of at least one capacitor in parallel with a corresponding one of the at least one intermediate diode, wherein a capacitance of the at least one capacitor is selected based on a high frequency level of at least one of a pair of intermediate nodes to which the at least one capacitor is coupled.

12. The method of claim 11, wherein the at least one intermediate diode comprises a plurality of intermediate diodes including a first intermediate diode coupled to the first diode and a last intermediate diode coupled to the last diode, and wherein said coupling each of at least one resistor comprises coupling each of a plurality of resistors in parallel with a corresponding one of the plurality of intermediate diodes.

13. The method of claim 12, further comprising increasing resistances of the plurality of resistors from a first resistor coupled in parallel with the first intermediate diode to a last resistor coupled in parallel with the last intermediate diode.

14. The method of claim 11, further comprising decreasing capacitances of the plurality of capacitors from a first capacitor coupled in parallel with the first intermediate diode to a last capacitor coupled in parallel with the last intermediate diode.

15. A method of linearizing a load of a string of diodes coupled in series between a signal pad and a reference pad of an integrated circuit, wherein the diode string comprises a first diode coupled to the signal pad, a last diode coupled to the reference pad, and at least one intermediate diode coupled between the first and last diodes, said method comprising:
coupling each of at least one resistor in parallel with a corresponding one of the at least one intermediate diode; and
coupling each of at least one capacitor in parallel with a corresponding one of the at least one intermediate diode, wherein a capacitance of the at least one capacitor is selected based on a high frequency level of the at least one intermediate node.

16. The method of claim 15, wherein the plurality of diodes comprises at least four diodes, wherein the at least one intermediate diode comprises a plurality of intermediate diodes including a first intermediate diode coupled to the first diode and a last intermediate diode coupled to the last diode, and wherein said method comprises:

coupling each of a plurality of resistors in parallel with a corresponding one of the plurality of intermediate diodes;

increasing resistances of the plurality of resistors from a first resistor coupled in parallel with the first intermediate diode to a last resistor coupled in parallel with the last intermediate diode;

coupling each of a plurality of capacitors in parallel with a corresponding one of the plurality of intermediate diodes; and decreasing capacitances of the plurality of capacitors from a first capacitor coupled in parallel with the first intermediate diode to a last capacitor coupled in parallel with the last intermediate diode.

\* \* \* \* \*